United States Patent [19]

Ahlstrom et al.

[11] Patent Number: 4,498,132
[45] Date of Patent: Feb. 5, 1985

[54] DATA PROCESSING SYSTEM USING OBJECT-BASED INFORMATION AND A PROTECTION SCHEME FOR DETERMINING ACCESS RIGHTS TO SUCH INFORMATION AND USING MULTILEVEL MICROCODE TECHNIQUES

[75] Inventors: John K. Ahlstrom, Mountain View, Calif.; Brett L. Bachman, Boston, Mass.; Richard A. Belgard, Saratoga, Calif.; David H. Bernstein, Ashland; Richard G. Bratt, Wayland, both of Mass.; Gerald F. Clancy, Saratoga, Calif.; Edward S. Gavrin, Lincoln, Mass.; Ronald H. Gruner, Cary; Thomas M. Jones, Chapel Hill, both of N.C.; Lawrence H. Katz, Oregon City, Oreg.; Craig J. Mundie, Cary, N.C.; Michael S. Richmond, Pittsboro, N.C.; Stephen I. Schleimer, Chapel Hill, N.C.; Steven J. Wallach, Saratoga, Calif.; Walter A. Wallach, Jr., Raleigh; Douglas M. Wells, Chapel Hill, both of N.C.

[73] Assignee: Data General Corporation, Westboro, Mass.

[21] Appl. No.: 266,413

[22] Filed: May 22, 1981

[51] Int. Cl.³ .............................................. G06F 9/22
[52] U.S. Cl. .................................................... 364/200
[58] Field of Search ............................ 364/200, 900

[56] References Cited

U.S. PATENT DOCUMENTS

| | | | |
|---|---|---|---|
| 4,025,901 | 5/1977 | Bachman et al. | 364/200 |
| 4,042,972 | 8/1977 | Gruner et al. | 364/200 |
| 4,323,964 | 4/1982 | Gruner | 364/200 |
| 4,347,566 | 8/1982 | Koda et al. | 364/200 |
| 4,394,736 | 7/1983 | Bernstein et al. | 364/200 |
| 4,398,243 | 8/1983 | Holberger et al. | 364/200 |

*Primary Examiner*—Raulfe B. Zache
*Assistant Examiner*—Archie E. Williams, Jr.
*Attorney, Agent, or Firm*—Robert F. O'Connell

[57] ABSTRACT

A digital data processing system has a memory organized into objects containing at least operands and instructions. Each object is identified by a unique and permanent identifier code which identifies the data processing system and the object. The system further uses multilevel microcode techniques for controlling sequences of microinstructions and for controlling the interval operations of the processor. The system uses a protection technique to prevent unauthorized access to objects by users who are identified by a subject number which identifies the user, a process of the system for executing a user's procedure, and the type of operation of the system to be performed by the user's procedure. An access control list for each object includes an access control list entry for each subject having access rights to the object and means for confirming that a particular active subject has access rights to a particular object before permitting access to the object. The system also includes stacks for containing information relating to the current state of execution of the system.

47 Claims, 1 Drawing Figure

DATA PROCESSING SYSTEM USING OBJECT-BASED INFORMATION AND A PROTECTION SCHEME FOR DETERMINING ACCESS RIGHTS TO SUCH INFORMATION AND USING MULTILEVEL MICROCODE TECHNIQUES

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system in which information, including operands and instructions, can be organized as objects each of which is identified by a unique and permanent code number and which includes protection means for preventing unauthorized access by a user to objects of another user flexible user interface and flexible, multileveled.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The digital computer system of the present invention includes a memory system comprising mass storage devices and one or more processors connected to the memory system. The memory system is organized into objects containing data items, e.g., operands and instructions, each object being identified by an object identifier. Locations of data items in the memory system are specified by means of the object identifier for the object containing the data item. The object identifier includes a code field which identifies the time of creation of the object relative to a selected initial time which is common to a plurality of digital computer systems.

User level instructions are translated to S-level instructions that are interpreted and executed by sequences of microinstructions which are primarily concerned with the execution of S-level operations of user programs and of certain internal operations of the processor. The system further includes separate stack means related to each such type of operation which store the current state of execution of the system in each case. The objects contain information relating to the current state of execution.

Access to the data items in objects is controlled by protection mechanisms of the systems. When the digital computer system processes data in an object, it does so for a subject representing an entity using the computer system. An access control list associated with each object defines sets of subjects in a set of memory operations which a subject in a given set of subjects may perform on data items in the object. A memory operation on a data item in an object succeeds only if there is an access control list entry associated with the object which allows the subject for whom the processor is performing the memory operation to perform that operation on the data in the object.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is a further object of the present invention to provide an improved information protection mechanism.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

Figure 1:
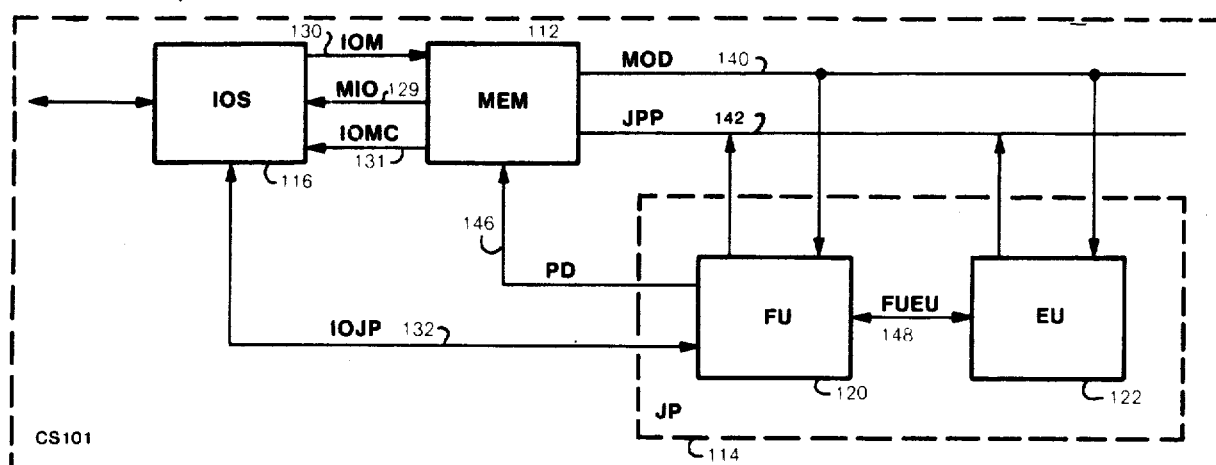
FIG. 1 is a partial block diagram of a computer system incorporating the present invention.

This application incorporates by reference the entire application, Ser. No. 266,402, filed on May 22, 1981, of Baxter et al., now issued as U.S. Pat. No. 4,455,602, on June 19, 1984.

More particularly, attention is directed to FIGS. 4–6, 103, 107, 109, 202, 202A, 203, 274, 304 and 404 of the drawings in application Ser. No. 266,402, and to that part of the descriptive portion of the specification, particularly at pages 54 et seq., 143 et seq., 154 et seq., 344 et seq., 475 et seq., 593 et seq., 729 et seq., 769 et seq., and 775 et seq. thereof, which relate to the subject matter of the claims herein.

What is claimed is:

1. In a digital computer system including processor means for performing operations on operands, memory means for storing instructions for controlling said processor means, bus means for conducting instructions between said memory means and said processor means, and I/O means for conducting operands between said processor means and devices external to said digital computer system, said memory means being organized into objects for containing operands and instructions, said processor means comprising:

means for uniquely identifying said objects, including
  memory organizing means responsive to first instructions for designating locations in said memory means or objects for containing items of information and
  means for generating unique identifier codes, each unique identifier code being uniquely and permanently associated with a corresponding object; said unique identifier code generating means including
    means for generating first unique identifier code fields for uniquely identifying said digital computer system;
    means for generating second unique identifier code fields for uniquely identifying each object of said memory means, and
    means responsive to second instructions for combining said first unique identifier code fields and said second unique identifier code fields and providing to said processor means said unique identifier codes to be permanently associated with corresponding objects generated by said processor means,
means for addressing said operands, including
  name table means for storing name table entries, each name table entry corresponding to one of a plurality of names and each name corresponding to an operand, each name table entry comprising (1) first data resolvable to provide a location in said memory means of the operand referred to by said corresponding name, and, (2) second data identifying the format of the operand referred to by said corresponding name,
  means connected to said bus means and responsive to said names for reading the name table entries corresponding to the names from said name table means, and
  means connected to said reading means for resolving said name tables entries for providing outputs to said memory means representing locations in said memory means of operands referred to by said names read from said memory means, protection means for preventing a first user, currently using said digital computer system to execute a program comprising an object containing selected instructions, from obtaining unauthorized access to objects of a second user, including:

subject number memory means responsive to the operation of said processor means for storing a currently active subject number of a plurality of subject numbers, each subject number corresponding to one of a plurality of subjects wherein each subject comprises the combination of (1) a user of said digital computer system, (2) a process of said digital computer system for executing a procedure of said user, and (3) the type of operation to be performed by said digital computer system in response to an instruction of a procedure of said user, and said currently active subject number identifies a first user currently utilizing said digital computer system, (2) a process currently executing a procedure of said first user's program, and (3) the type of operation to be performed by said digital computer system in response to a current instruction of a procedure of said first user's program, protection memory means for storing at least one access control list, each access control list corresponding to an object and comprising at least one access control entry, each access control entry corresponding to a subject having access rights to the corresponding object and containing the access rights of said subject to its corresponding object, and access right confirmation means responsive to a currently active subject number and to the operation of said processor means for indexing said protection means in response to a current instruction of a procedure of said first user's program when said current instruction requests access to a an object and for comparing the access rights of the currently active subject to said object, ALU means connected to said bus means for performing operations directed by said instructions, first microcode means connected to said bus means for storing first selected sequences of microinstructions for controlling the operations of said ALU means directed by said instructions, at least one sequence of microinstructions of said first selected sequences of microinstructions corresponding to each instruction, said instructions being S-Language instructions having a uniform, fixed format, and second mircocode means connected to said bus means for storing second selected sequences of microinstructions for controlling internal operations of said processor means, said first microcode means being responsive to said instructions to provide the first selected sequences of microinstructions to said ALU means, and said second microcode means responsive to operation of said processor means to provide the second selective microinstruction sequences to said ALU means.

2. The digital computer system of claim 1, wherein said objects include data objects containing data.

3. The digital computer system of claim 1, wherein said objects include procedure objects containing instructions and names.

4. The digital computer system of claim 1, wherein said processor means and said memory means further comprise: stack means responsive to third selected instructions for storing information relating to the current state of execution of instructions, and objects include stack objects containing said information relating to the current state of execution of said instructions.

5. The digital computer system of claim 1, wherein said memory means further comprises means for storing the unique identifier codes of active objects currently being used in said digital computer system.

6. The digital computer system of claim 1, wherein said first unique identifier code fields comprise a group number sub-field and a selectable serial number sub-field, at least one group number being uniquely and permanently assigned to said digital computer system.

7. The digital computer system of claim 6, wherein said group number sub-field and said serial number sub-field together contain 32 bits of binary information.

8. The digital computer system of claim 7, wherein said means for generating said first unique identifier code fields includes memory means having outputs to said combining means for providing said group number sub-field and said serial number sub-field.

9. The digital computer system of claim 1, wherein said second unique identifier code fields are comprised of an architectural clock field containing binary information representing the elapsed time interval from a selected initial time.

10. The digital computer system of claim 9, wherein said selected initial time is common to each digital computer system of a plurality of digital computer systems.

11. The digital computer system of claims 9 or 10 wherein said means for generating said second unique identifier code fields further comprises: architectural clock means for generating architectural clock signals at predetermined intervals, and architectural counter means having outputs to said processor means for counting said architectural clock signals.

12. The digital computer system of claim 9, wherein said second unique identifier code fields contain 48 bits of binary information.

13. The digital computer system of claim 12, wherein the least significant bit of said second unique identifier code fields represents elapsed time intervals of substantially no greater than 600 picoseconds, and the most significant bit of said second unique identifier code fields represent an elapsed time interval of substantially no less than 127 years.

14. The digital computer system of claim 1, wherein each of said names has a uniform format.

15. The digital computer system of claim 1, wherein:

each said procedure further includes a name table pointer representing a base location is said memory means, and said first data of each name table entry of a procedure is resolvable to provide a location in said memory means relative to said name table pointer of an operand referred to by a corresponding name of each procedure, and said resolving means further comprises base register means connected to said bus means and having outputs to said resolving means for receiving and storing the name table pointer of a procedure currently controlling the operations being performed by said processor means.

16. The digital computer system of claim 1, wherein said processor means further comprises:
   name cache means connected to outputs of said resolving means and having outputs to said memory means for storing the resolving means outputs representing locations of operands in said memory means,
   said name cache means connected to said reading means and responsive to said names to provide name cache outputs to said memory means representing said locations in said memory means of selected operands for which said name cache means has received and stored said resolving means outputs.

17. The digital computer system of claim 1, wherein each of said S-Language instructions is written in an S-Language dialect of a plurality of S-Language dialects,
   said receiving means further comprises dialect code means for storing a dialect code of a plurality of dialect codes, each dialect code of said plurality of dialect codes corresponding to an S-Language dialect of said plurality of S-Language dialects, and a current dialect code representing the S-Language dialect in which a current S-Language instruction is written
   said sequences of microinstructions include a set of sequences of microinstructions corresponding to each S-Language dialect, each set of sequences of microinstructions including at least one sequence of microinstructions corresponding to each S-Language instruction in a corresponding S-Language dialect, and
   said microcode control means is responsive to each said current dialect code and to each current S-Language instruction to provide to said ALU means at least one sequence of microinstructions corresponding to each current S-Language instruction.

18. The digital computer system of claim 17, wherein said microcode control means further comprises:
   control store means for storing said sequences of microinstructions for controlling said ALU means, and
   dispatch table means for storing addresses corresponding to locations in said control store means of each sequence of microinstructions,
      said dispatch table means being responsive to a current dialect code and to a current instruction to provide to said control store means an address corresponding to a microinstruction sequence corresponding to said current S-Language instructions, and
      said control store means being responsive to an address to provide to said ALU means a microinstruction sequence corresponding to said current S-Language instruction.

19. The digital computer system of claims 1 or 17 or 18, wherein said receiving means further comprises:
   instruction register means connected to said bus means for storing at least one S-Language instruction, and
   parsing means connected to said instruction register means for detecting S-Language instructions stored in said instruction register means and for providing S-Language instructions to said microcode control means.

20. The digital computer system of claim 19, wherein said reading and receiving means further comprises:
   prefetch means connected to said bus means and responsive to the operation of said parsing means for providing read request outputs to said memory means, and
   said memory means is responsive to said prefetch means read request outputs to provide S-Language instructions to said reading and receiving means.

21. The digital computer system of claims 1 or 17, wherein said microcode control means further comprises:
   writable control store means connected to said bus means for storing said sequence of microinstructions, and
   control store addressing means responsive to said S-Language instructions and to the operation of said processor means for generating corresponding control store read and write addresses,
      said writable control store means being responsive to said read addresses to provide corresponding sequence of microinstructions to said ALU means, and
      being further responsive to said write addresses to receive and store said sequences of microinstructions.

22. The digital computer system of claim 18, wherein said central store means further comprises:
   writable control store means connected to said bus means for receiving and storing said sequences of microinstructions, and
   said dispatch table means further comprises write address means responsive to the operation of said processor means for generating write addresses,
      said writable control store means being responsive to said write addresses for storing said sequences of microinstructions.

23. The digital computer system of claim 1, wherein said processor means further comprises:
   protection cache means responsive to the operation of said processor means and to a currently active subject number for storing access rights read from said protection memory means and for comparing access rights of said currently active subject to selected objects.

24. The digital computer system of claim 1, wherein said processor means further comprises:
   monitor microcode means for storing sequences of monitor microinstructions for controlling monitor operations of said ALU means,
   the monitor means responsive to said operation of said processor means to provide sequences of monitor microinstructions to said ALU means.

25. The digital computer system of claim 1, wherein:
   said instructions are S-Language instructions in a plurality of S-Language dialects, and
   said first selected sequences of microinstructions include at least one sequence of microinstructions corresponding to an instruction for each S-Language dialect of said plurality of S-Language dialects.

26. The digital computer system of claims 1 or 24, wherein said processor means further comprises:
arithmetic means connected to said bus means for performing arithmetic operations on selected operations, said arithmetic means including
arithmetic microcode means for storing sequences of arithmetic microinstructions for controlling the operation of said arithmetic means, and
said arithmetic microcode means is responsive to the operation of said processor means to provide a sequence of arithmetic microinstructions to said arithmetic means.

27. The digital computer system of claim 1, wherein said processor means further comprises:
microinstructions stack means connected to said ALU means and responsive to the operation of said ALU means for storing at least one microinstruction stack frame for storing the state of execution of a microinstruction of said first or second selected sequences of microinstructions.

28. The digital computer of claim 27, wherein said memory means further comprises:
memory microinstruction stack means for storing a plurality of microinstruction stack frames, each one of said plurality of said microinstruction stack frames for storing state of execution of a microinstruction of said first or second certain sequences of microinstructions, and
said microinstruction stack means further comprises microinstruction stack control means responsive to the operation of said ALU means for providing stack control signals to said microinstructions stack means and to said memory microinstruction stack means for controlling the transfer of said microinstruction stack frames between said microinstruction stack means and said memory microinstruction stack means.

29. The digital computer system of claim 24, wherein said processor means further comprises:
monitor stack means connected to said ALU means and responsive to the operation of said ALU means for storing at least one monitor stack frame for storing the state of execution of a monitor microinstruction.

30. The digital computer system of claim 26, wherein said processor means further comprises:
arithmetic stack means connected to said arithmetic means and responsive to the operation of said arithmetic means for storing at least one arithmetic stack frame for storing the state of execution of an arithmetic microinstruction.

31. The digital computer system of claim 30, wherein said memory means further comprises:
memory arithmetic stack means for storing a plurality of arithmetic stack frames, each of said microinstruction stack frames storing the state of execution of an arithmetic microinstruction, and
said arithmetic stack means further comprises arithmetic stack control means responsive to the operation of said arithmetic means for providing control signals to said arithmetic stack means and to said memory arithmetic stack means for controlling the transfer of arithmetic stack frames between said arithmetic stack means and said memory arithmetic stack means.

32. The digital computer system of claim 1 or 24 or 25, wherein said memory means further comprises:
instruction stack means responsive to the operation of at least said ALU means for storing at least one instruction stack frame for storing the state of execution of an instruction.

33. The digital computer system of claim 26, wherein said memory means further comprises:
instruction stack means responsive to the operation of said ALU means for storing at least one instruction stack frame for storing state of execution of an instruction.

34. In a digital computer system including processor means for performing operations on operands and memory means for storing instructions for controlling said processor means, said memory means being organized into objects for containing said operands and instructions, said processor means comprising:
means for uniquely identifying said objects, including
memory organizing means responsive to first instructions for designating locations in said memory means as objects for containing items of information, and
means for generating unique identifier codes, a unique idendifier code being uniquely and permanently associated with a corresponding object generated by said processor means,
means for addressing said operands comprising:
name table means for storing name table entries, each name table entry corresponding to a name of a procedure and each name table entry comprising data resolvable to provide a location in said memory means of an operand referred to by said corresponding name, and
means responsive to said names for resolving each name table entry so as to provide outputs to said memory means representing locations in said memory means of said operands,
protection means for preventing a user, currently using said digital computer system to execute a program comprising a procedure object containing selected instructions, from obtaining unauthorized access to selected objects, including:
subject number memory means responsive to the operation of said processor means for storing a currently active subject number of a plurality of subject numbers,
each subject number corresponding to one of a plurality of subjects wherein each subject comprises the combination of (1) a user of said digital computer system, (2) a process of said digital computer system for executing a procedure of said user, and (3) the type of operation to be performed by said digital computer system in response to an instruction of a procedure of said user, and
said currently active subject number identifies the user currently utilizing said digital computer system, (2) a process currently executing a procedure of said user's program, and (3) the type of operation to be performed by said digital computer system in response to a a current instruction of a procedure of said user's program,
protection memory means for storing at least one access control list, each access control list corresponding to an object and comprising at least one access control entry, each access control entry corresponding to a subject having access rights to said corresponding object and containing the access rights of said subject to said corresponding object, and access rights means responsive to a currently active subject number and to the operation of said processor means for indexing said protection means in response to a current instruction of a procedure of said first user's program when said current instruction requests access to an object and for comparing the access rights of a currently active subject to said object, ALU means for performing operations directed by said instructions.

first microcode means for storing first selected sequences of microinstructions for controlling operations of said ALU means directed by said instructions, said instructions being S-Language instructions having a uniform, fixed format, said first microcode means responsive to said instructions to provide corresponding first selected sequences of microinstructions to said ALU means, and second microcode means connected to said bus means for storing second selected sequences of microinstructions for controlling internal operations of said processor means, said second microcode means responsive to the operation of said processor means to provide said second selected microinstruction sequences to said ALU means.

35. The digital computer system of claim 34, wherein said objects include data objects containing data.

36. The digital computer system of claim 34, wherein said objects include procedure objects containing instructions and names.

37. The digital computer system of claim 34, wherein said processor means and said memory means further comprise: stack means responsive to third selected instructions for storing information relating to the current state of execution of said instructions, and said objects include stack objects containing information relating to the current state of execution of said instructions.

38. The digital computer system of claim 34, wherein said memory means further comprises means for storing said unique identifier codes of active objects currently being used in said digital computer system.

39. The digital computer system of claim 34, wherein said processor means further comprises:

monitor microcode means for storing sequences of monitor microinstructions for controlling monitor operations of said ALU means, said monitor means being responsive to the operation of said processor means to provide sequences of monitor microinstructions to said ALU means.

40. The digital computer system of claims 34 or 39, wherein said processor means further comprises:

arithmetic means for performing arithmetic operations on selected operations, said arithmetic means including arithmetic microcode means for storing sequences or arithmetic microinstructions for controlling the operation of said arithmetic means, and said arithmetic microcode means is responsive to the operation of said processor means to provide a sequences of arithmetic microinstructions to said arithmetic means.

41. The digital computer system of claim 34, wherein said processor means further comprises:

microinstruction stack means responsive to the operation of said ALU means for storing at least one microinstruction stack frame for storing the state of execution of a microinstruction of said first or second selected sequences of microinstructions.

42. The digital computer of claim 41, wherein said memory means further comprises:

memory microinstruction stack means for storing a plurality of microinstruction stack frames, each of said microinstruction stack frames storing the state of execution of a microinstruction of said first or second selected sequences of microinstructions, and said microinstruction stack means further comprises microinstruction stack control means responsive to the operation of said ALU means for providing stack control signals to said microinstructions stack means and to said memory microinstruction stack means for controlling the transfer of microinstruction stack frames between said microinstruction stack means and said memory microinstruction stack means.

43. The digital computer system of claim 39, wherein said processor means further comprises:

monitor stack means responsive to the operation of said ALU means for storing at least one monitor stack frame for storing the state of execution of a monitor microinstruction.

44. The digital computer system of claim 40, wherein said processor means further comprises:

arithmetic stack means responsive to the operation of at said arithmetic means for storing at least one arithmetic stack frame for storing the state of execution of an arithmetic microinstruction.

45. The digital computer system of claim 44, wherein said memory means further comprises:

memory arithmetic stack means for storing a plurality of arithmetic stack frames, each one of said of microinstruction stack frames storing the state of execution of an arithmetic microinstruction, and said arithmetic stack means further comprises arithmetic stack control means responsive to the operation of said arithmetic means for providing control signals to said arithmetic stack means and to said memory arithmetic stack means for controlling the transfer of arithmetic stack frames between said arithmetic stack means and said memory arithmetic stack means.

46. The digital computer system of claim 34 or 39, wherein said memory means further comprises:

instruction stack means responsive to the operation of said ALU means for storing at least one instruction stack frame for storing the state of execution of an instruction.

47. The digital computer system of claim 40, wherein said memory means further comprises:

instruction stack means responsive to the operation of at said ALU means for storing at least one instruction stack frame for storing the state of execution of an instruction.

* * * * *